United States Patent
Ao et al.

(10) Patent No.: US 10,892,439 B2
(45) Date of Patent: Jan. 12, 2021

(54) DISPLAY PANEL HAVING FILLER LAYER AND HEAT DISSIPATION LAYER AND PACKAGING METHOD THEREOF, AND DISPLAY APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Ning Ao, Beijing (CN); Qun Ma, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 854 days.

(21) Appl. No.: 15/758,124

(22) PCT Filed: Jun. 26, 2015

(86) PCT No.: PCT/CN2015/082454
§ 371 (c)(1),
(2) Date: Mar. 7, 2018

(87) PCT Pub. No.: WO2016/086650
PCT Pub. Date: Jun. 9, 2016

(65) Prior Publication Data
US 2020/0243795 A1    Jul. 30, 2020

(30) Foreign Application Priority Data
Dec. 3, 2014 (CN) .......................... 2014 1 0728206

(51) Int. Cl.
*H01L 29/08* (2006.01)
*H01L 33/00* (2010.01)
(Continued)

(52) U.S. Cl.
CPC ........ *H01L 51/5246* (2013.01); *H01L 23/295* (2013.01); *H01L 33/64* (2013.01);
(Continued)

(58) Field of Classification Search
CPC ... H01L 51/5246; H01L 51/529; H01L 51/56; H01L 51/5253; H01L 33/64; H01L 23/295
See application file for complete search history.

(56) References Cited

U.S. PATENT DOCUMENTS

| | | | |
|---|---|---|---|
| 7,872,338 B2 * | 1/2011 | Tarn | ......... H01L 23/10 257/680 |
| 8,264,143 B2 * | 9/2012 | Bae | ...... H01L 51/5246 313/504 |

(Continued)

FOREIGN PATENT DOCUMENTS

| CN | 1338712 A | 3/2002 |
|---|---|---|
| CN | 1779984 A | 5/2006 |

(Continued)

OTHER PUBLICATIONS

Office Action dated Apr. 28, 2019, issued in counterpart CN Application No. 201410728206.6, with English translation. (13 pages).

(Continued)

*Primary Examiner* — Alonzo Chambliss
(74) *Attorney, Agent, or Firm* — Westerman, Hattori, Daniels & Adrian, LLP

(57) ABSTRACT

A display panel. The display panel may include a substrate having a display region and a non-display region; a cover (Continued)

plate; a sealant between the substrate and the cover plate; and a filler layer covered by the sealant to cause the sealant to have tight contact with the substrate and with the cover plate. The sealant may be in the non-display region for bonding the substrate and the cover plate.

18 Claims, 6 Drawing Sheets

(51) Int. Cl.
  *H01L 31/0203* (2014.01)
  *H01L 23/12* (2006.01)
  *H01L 21/00* (2006.01)
  *H01L 51/40* (2006.01)
  *H01L 51/52* (2006.01)
  *H01L 51/56* (2006.01)
  *H01L 33/64* (2010.01)
  *H01L 23/29* (2006.01)

(52) U.S. Cl.
  CPC ........ *H01L 51/529* (2013.01); *H01L 51/5253* (2013.01); *H01L 51/56* (2013.01)

(56) References Cited

U.S. PATENT DOCUMENTS

| | | | |
|---|---|---|---|
| 2009/0115325 A1 | 5/2009 | Matsuzaki et al. | |
| 2010/0117525 A1* | 5/2010 | Warashina | H01L 51/5246 313/504 |
| 2010/0267179 A1* | 10/2010 | Miyairi | H01L 21/3086 438/34 |
| 2011/0215713 A1 | 9/2011 | Kang et al. | |
| 2011/0303943 A1 | 12/2011 | Lee et al. | |
| 2013/0147346 A1* | 6/2013 | Su | H01L 51/5246 313/512 |
| 2015/0171364 A1* | 6/2015 | Bae | H01L 51/5246 257/40 |

FOREIGN PATENT DOCUMENTS

| | | |
|---|---|---|
| CN | 101431147 A | 5/2009 |
| CN | 101866584 A | 10/2010 |
| CN | 101867023 A | 10/2010 |
| CN | 102280593 A | 12/2011 |
| CN | 102983279 A | 3/2013 |
| CN | 102983290 A | 3/2013 |
| CN | 203134801 U | 8/2013 |
| CN | 104465704 A | 3/2015 |
| GB | 2467547 A | 8/2010 |
| TW | 201002129 A1 | 1/2010 |

OTHER PUBLICATIONS

International Search Report dated Jun. 26, 2015, issued in counterpart International Application No. PCT/CN2015/082454 (12 pages).

* cited by examiner

A-A

DISPLAY PANEL HAVING FILLER LAYER AND HEAT DISSIPATION LAYER AND PACKAGING METHOD THEREOF, AND DISPLAY APPARATUS

CROSS-REFERENCES TO RELATED APPLICATIONS

This PCT patent application claims priority of Chinese Patent Application No. 201410728206.6, filed on Dec. 23, 2014, the entire contents of which are incorporated by reference herein.

FIELD OF THE INVENTION

The present invention generally relates to the field of display technologies and, more particularly, to display panel and packaging processes thereof, and display apparatus.

BACKGROUND

Organic Light-emitting Diode (OLED) display is a new type of display. Comparing with liquid-crystal display (LCD), OLED display has the advantages of self-emission, fast response, and wide viewing angle, etc., and has been developed rapidly.

During fabrication of OLED display panels, the packaging process is a key step. The packaging process directly determines the life span of the OLED display panels. In order to achieve water-proof and air-tight packaging effect, the glass glue used in the packaging process includes glass powder as the main ingredient, which is then mixed with water and other medium to form a frit.

FIGS. 1-3 illustrate an existing packaging process of an OLED display panel. The packaging process includes four steps: screen-printing, i.e., printing the frit 301 on a non-display region on the bottom substrate 101), pre-baking, sintering, and coupling and laser sealing. However, after the sintering process, as shown in FIG. 2, which is a cross-sectional view of the display panel packaging structure along the AA direction illustrated in FIG. 1, the top surface of the gel-phase frit 301 is concave-shaped. After the subsequent laser sealing, as shown in FIG. 3, a gap is formed between the top surface of the frit 301 and the cover plate 201. Thus, the sealing effect of the display panel packaging is affected.

Thus, using such existing packaging processes, it is easy for the external air and/or water vapor to enter into the display panel. Therefore, the life span of the display panel will be affected. At the same time, the anti-shock ability of the display panel may be reduced. The disclosed methods and systems are directed to at least partially alleviate one or more problems set forth above and other problems.

BRIEF SUMMARY OF THE DISCLOSURE

The purposes of the present invention include providing a display panel and a packaging method thereof, and a display apparatus to improve the tightness of the display panel packaging structure; and prevent external air and water vapor from entering into the display panel.

The display panel includes a substrate and a facing cover plate. The substrate includes a display region and a non-display region. A sealant is formed between the substrate and the cover plate. The sealant is formed in the non-display region of the substrate. The display panel also includes a filler layer covered by the sealant to cause the sealant to have tight contact with the substrate and with the cover plate.

Optionally, the filler layer is formed on the substrate, and in the center of a cross-section of the sealant perpendicular to the coating direction of the sealant.

Optionally, the thermal expansion coefficient of the filler layer is substantially consistent with the thermal expansion coefficient of the sealant.

Optionally, the material for forming the filler layer includes one of Ti and Ti alloy.

Optionally, a heat dissipation layer is formed between the substrate and the sealant, and the filler layer is disposed between the sealant and the heat dissipation layer.

Optionally, the width of the heat dissipation layer is greater than the width of the filler layer on a cross-section of the sealant perpendicular to the coating direction of the sealant.

Optionally, a width of the filler layer is approximately 20%~30% of a width of the sealant on a cross-section of the sealant; and a height of the filler layer is approximately 15%~20% of a height of the sealant on the cross-section of the sealant.

Optionally, the material for forming the sealant includes glass powder. The glass powder includes one or more of $SiO_2$ powder, $CaCO_3$ powder, ZnO powder, or $TiO_2$ powder, etc.

Correspondingly, the present disclosure also provides a display panel packaging method. The packaging method includes providing a substrate having a display region and a non-display region; providing a cover plate; forming a filler layer in the non-display region of the substrate; forming a sealant covering the filler layer to cause the sealant to form a convex-shaped top surface and, during an sintering process, coupling and bonding the cover plate with the substrate by pressing the cover plate on the convex-shaped top surface of the sealant such that the sealant forms tight contact with the substrate and with the cover plate Optionally, the steps for forming the sealant covering the filler layer in the non-display region of the substrate includes forming a first material layer on the substrate; forming a pattern having the filler layer in the first material layer by a patterning process; and forming the sealant on the substrate having the filling structure, wherein the filler layer is in the center of a cross-section of the sealant.

Optionally, the thermal expansion coefficient of the filler layer is substantially consistent with the thermal expansion coefficient of the sealant.

Optionally, the material for forming the first material layer includes one of Ti and Ti alloy.

Optionally, before forming the first material layer, the method further includes forming a second material layer on the substrate; and patterning the second material layer to form a pattern having the heat dissipation layer after forming the filler layer in the first material layer by a patterning process.

Optionally, when the first material layer and the second material layer are a same material, the filler layer and the heat dissipation layer are formed by a one-step patterning process.

Optionally, the width of the heat dissipation layer is greater than a width of the filler layer on a cross-section of the sealant.

Optionally, the width of the filler layer is approximately 20%~30% of a width of the sealant on a cross-section of the sealant; and a height of the filler layer is approximately 15%~20% of a height of the sealant.

Optionally, the material for forming the sealant includes glass powder. The glass powder includes one or more of $SiO_2$ powder, $CaCO_3$ powder, ZnO powder, or $TiO_2$ powder, etc.

Optionally, at least one of the heat dissipation layer and the filler layer is grinded to increase the surface roughness.

Optionally, the heat filler layer and the heat dissipation layer are both Ti.

Correspondingly, the present disclosure also provide a display apparatus containing at least one disclosed display panel.

Thus, according to the present disclosure, the display panel includes a filler layer covered by a sealant. During the packaging process, the top surface of the sealant after the sintering process may form a ridge. In the circumstance that the cover plate and the substrate are coupled and being laser sealed, the sealant at the highest point of the ridge flows toward two sides of the sealant. Thus, the final surfaces of the sealant can have tight contact with the cover plate and the substrate; and the adhesion force between the cover plate and the sealant may be increased. Therefore, it may prevent external air and water vapor from entering into the display panel; and the life span of the display panel may be increased. Further, the tighter contact between the cover plate and the substrate may enhance the anti-shock ability of the display panel.

Other aspects of the present disclosure can be understood by those skilled in the art in light of the description, the claims, and the drawings of the present disclosure.

BRIEF DESCRIPTION OF THE DRAWINGS

Drawings are used as a part of the disclosure to further illustrate the present invention. The drawings and following embodiments are used to further explain the disclosed invention; and do not constitute limitations of the invention. In the drawings.

DETAILED DESCRIPTION

Reference will now be made in detail to exemplary embodiments of the invention, which are illustrated in the accompanying drawings. The detailed descriptions only illustrate certain exemplary embodiments of the present invention, and are not intended to limit the scope of the present invention.

Figure 5:
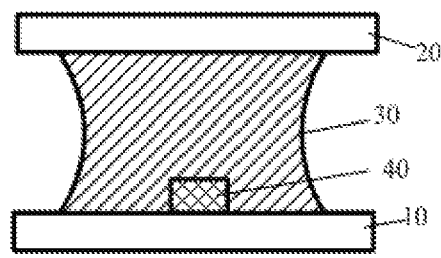
FIG. 5 illustrates a portion of an exemplary display panel after a sealing process according to the disclosed embodiments.

One aspect of the present disclosure includes a display panel. As shown in FIG. 5, the display panel may include a substrate 10 and a cover plate 20 facing the substrate 10. In certain embodiments, if the substrate 10 and the cover plate 20 are made of glass, the substrate 10 and the cover plate 20 may be referred as an encapsulating glass (EN Glass) and a backplane glass (BP Glass), respectively.

The substrate 10 may have a display region (not labeled) and a non-display region (not labeled). Sealant 30 may be formed between the substrate 10 and the cover plate 20 in the non-display region of the substrate 10. In one embodiment, the sealant may be a frit structure made of glass glue. Thus, the sealant 30 may be referred as frit 30. Further, the display panel may also include a filler layer 40; and the sealant 30 may cover the filler layer 40 such that the sealant 30 may have tight contact with the substrate 10 and the cover plate 20. In various embodiments, the substrate and the cover plate may be interchangeable. In other words, the cover plate may have a display region (not labeled) and a non-display region (not labeled).

Figure 4A:
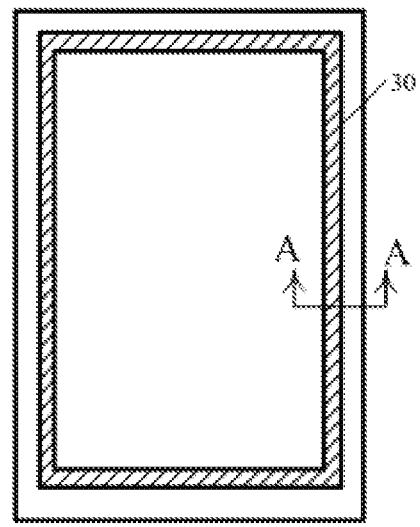
FIG. 4A illustrates a top view of an exemplary substrate with a sealant according to the disclosed embodiments.
Figure 4B:
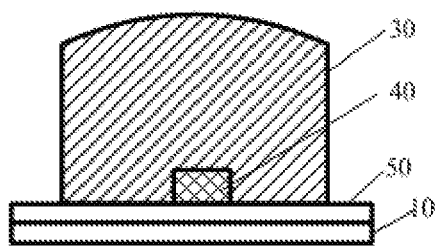
FIG. 4B illustrates an exemplary cross-section view of the sealant illustrated in FIG. 4A after a sintering process along the A-A direction according to the disclosed embodiments.

During a display panel packaging process, the filler layer 40 may be formed on the surrounding region of the display region of the substrate 10 (that is, the non-display region). Then, the gel-phase sealant 30 may be coated on the substrate 10 having the filler layer 40. As shown in FIG. 4A and FIG. 4B, the top surface of the gel-phase sealant 30 may form a ridge, i.e., the top surface is convex-shaped. In a practical packaging process, the sealant 30 may be sintered by a sintering process. After the sintering process, the top surface of the sealant 30 may still have the ridge. Under this circumstance, when the cover plate 20 and the substrate 10 are attached together by pressing the cover plate 20 and/or the substrate 10 against the sealant 30, and a laser sealing process is performed, the glass glue of the ridge on the top surface of the sealant 30 may flow toward two sides of the sealant 30. Thus, as shown in FIG. 5, the top surface of the sealant 30 may have tight contact with the cover plate 20, i.e., no space or substantially no space between the upper surface of the sealant 30 and the cover plate 20.

Further, after disposing the filler layer 40 in the sealant 30, the sealant 30 may have a certain structure after the laser sealing process. As shown in FIG. 5, along a height direction of the sealant 30, the width of the sealant 30 in the middle may be smaller than the width of the upper surface and the width of the face of the sealant 30. Such a structure may cause the adhesion between the sealant 30 and the cover plate 20 and the adhesion between the sealant 30 and the substrate to be tighter, and more stable.

On a cross-section of the sealant 30 perpendicular to the coating direction of the sealant 30, the width of the sealant 30 and the width of the filler layer 40 refer to the width of the cross-section of the sealant 30 and the width of the cross-section of the filler layer 40 perpendicular to the coating direction of the sealant 30. The height of the sealant 30 and the height of the filler layer 40 refer to the height of the cross-section perpendicular to the coating direction of the sealant 30. The coating direction refers to the coating direction during the coating process for forming the sealant 30. The sealant 30 may also be formed by other appropriate processes.

In the disclosed embodiments, the display panel includes the filler layer 40; and the sealant 30 covers the filler layer 40. The filler layer 40 may have a specific cross-section shape, such as a square, a rectangle, a triangle, or other geometric shapes or irregular shapes. The filler layer 40 may prevent the top surface of the sealant 30 from being concave-shaped such that the sealant 30 may have tight contact with the cover plate 20 and the substrate 10. The contact area between the sealant 30 and the cover plate 20 and the contact area between the sealant 30 and the substrate 10 may be increased.

Further, the adhesion force between the sealant 30 and the cover plate 20 and the adhesion force between the sealant 30 and the substrate 10 may be increased. Therefore, it may prevent the external air and/or water vapor from entering into the display panel; and may increase the service life of the display panel. At the same time, the tight contact between the sealant 30 and the cover plate 20 and between the sealant 30 and the substrate 10 may enhance the anti-shock ability of the display panel.

Figure 1:
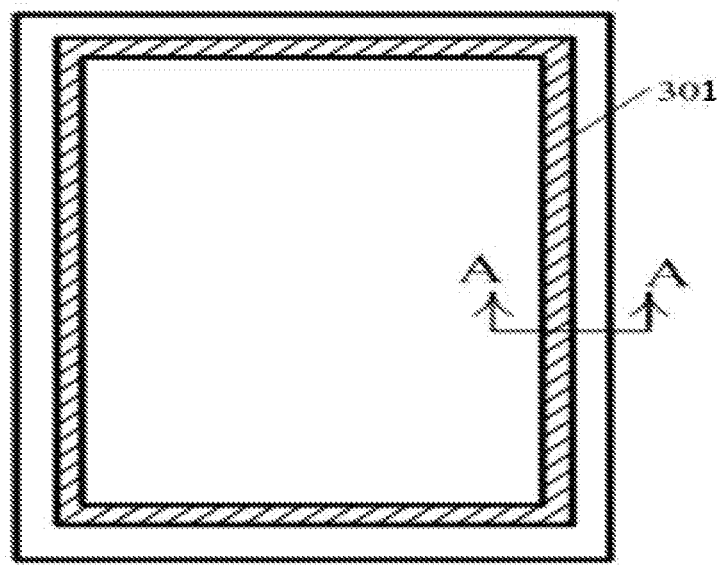
FIG. 1 illustrates a top view of a substrate with a sealant fabricated by an existing packaging process.
Figure 2:
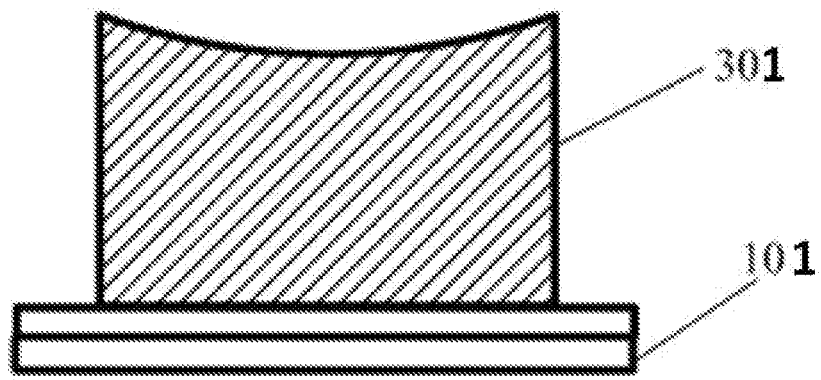
FIG. 2 illustrates a cross-sectional view of the structure illustrated in FIG. 1 along the A-A direction.
Figure 3:
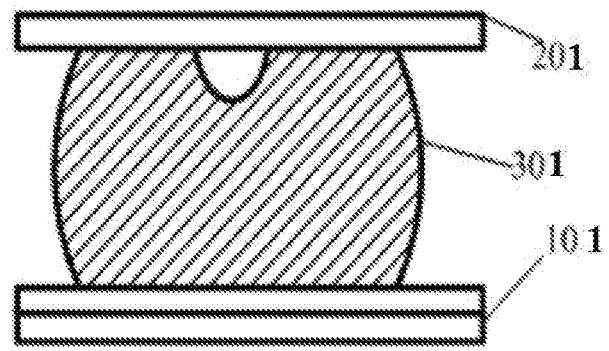
FIG. 3 illustrates a portion of an existing display panel after a sealing process.

If the filler layer 40 is not formed in the sealant 30, the sealant 30 may be concave-shaped as illustrated in FIG. 2. Therefore, in one embodiment, as shown in FIG. 4B and FIG. 5, the filler layer 40 is disposed on the substrate 10. From a cross-sectional view the filler layer 40 may be disposed in the center region of the sealant 30. Further, along the longitudinal direction, the filler layer 40 may be parallel to, or may follow the sealant 30.

In the disclosed embodiments, the material for forming the sealant 30 may include glass powder. The glass powder may include one or more of $SiO_2$ powder, $CaCO_3$ powder, ZnO powder, or $TiO_2$ powder, etc. During the display panel packaging process, the sealant 30 may go through the flowing phase changes: gel-phase→p powder-phase→p solid bulk phase. Specifically, when the sealant 30 is being coated, the gel-phase sealant 30 is coated on the non-display region of the substrate 10. After a sintering process, water and other media matters (such as organic solvent, etc.) may be evaporated; and the sealant 30 may become a solid powder-phase glass. The substrate 10 and the cover plate 20 may be glass substrates; and their composition may be close to the composition of the glass powder. Thus, during the laser sealing process, the sealant 30 may be instantly melted so as to better adhere to the cover plate 20 and the substrate 10. After being cooled down, the sealant 30 may become a solid bulk-phase glass in between the cover plate 20 and the substrate 10; and the solid bulk-phase glass bonds with the cover plate 20 and the substrate 10, respectively.

Further, the thermal expansion coefficient of the filler layer 40 may be substantially consistent with the thermal expansion coefficient of the sealant 30 such that the filler layer 40 and the sealant 30 may keep contact during the display panel packaging process. The thermal expansion of a matter may be a range. Thus, that the thermal expansion coefficient of the filler layer 40 may be substantially consistent with the thermal expansion coefficient of the sealant 30 may not mean that the range of the thermal expansion coefficient of the sealant 30 is the same as the range of the thermal expansion coefficient of the filler layer 40. It may only require a certain overlap. Of course, the range of the thermal expansion coefficient of the sealant 30 may also be substantially consistent with the range of the thermal expansion coefficient of the filler layer 40.

In one embodiment, the material for forming the filler layer 40 includes one of Ti and Ti alloy. The dimensions and/or shapes of the sealant 30 and the filler layer 40 may be designed to reach desired tight contact between the sealant 30 and the cover plate 20, for example, the gab illustrated in FIG. 2 may be analyzed. In one embodiment, the width of the filler layer 40 may be approximately 20%~30% of the width of the sealant 30; and/or the height of the filler layer 40 may be approximately 15%~20% of the height of the sealant 30. Thus, after the sintering process, the protruding height of the top surface of the sealant 30 may be in an appropriate range to allow the sealant 30 to have tight contact with the cover plate 20.

As shown in FIG. 4B and FIG. 5, usually, a heat dissipation layer 50 may be formed between the sealant 30 and the substrate 10. The heat dissipation layer 50 may prevent the local overheating generated during the sintering process from damaging the surrounding display devices.

The thermal expansion coefficient of the dissipation layer 50 may be substantially consistent with the thermal expansion coefficient of the glass powder and the thermal expansion coefficient of the filler layer 40. Thus, the filler layer 40, the sealant 30 and the heat dissipation layer 50 may have tight contact during the display panel packaging process. As mentioned above, the material for forming the sealant 30 may include glass powder; and the glass powder may include one or more of $SiO_2$ powder, $CaCO_3$ powder, ZnO powder, and $TiO_2$ powder. Preferably, the material of the heat dissipation layer 50 may include Ti, or Ti alloy. In the circumstance that the heat dissipation layer 50 is made of a material same as that of the filler layer 40, the filler layer 40 and the heat dissipation layer 50 may have tighter contact.

In one embodiment, the filler layer 40 and/or the heating dissipation layer 50 may be grinded or processed to increase the surface roughness. The increased surface roughness may increase the adhesion force between the sealant 30 and the filler layer 40 and/or the heat dissipation layer 50.

Further, on a cross-section of the sealant 30 perpendicular to the coating direction of the sealant 30, the width of the heat dissipation layer 50 is greater than the width of the filler layer 40.

According to the above descriptions of the disclosed display panel, during the frit packaging process of the display panel, a filler layer may be formed on the substrate, or on the heat dissipation layer, the sealant may cover the filling structure. The filler layer may be disposed at the middle of the sealant along the width direction. Thus, after the sintering process, the top surface of the sealant may form a ridge. After the laser sealing process, the upper surface of the sealant may be tightly contacted with the surface of the cover plate, and the adhesion force between the sealant and the cover plate may be increased. Thus, it may prevent the external air and/or water vapor from entering the display panel; and the life span of the display panel may be increased. At the same time, the anti-shock ability of the display panel may be enhanced.

Figure 15:
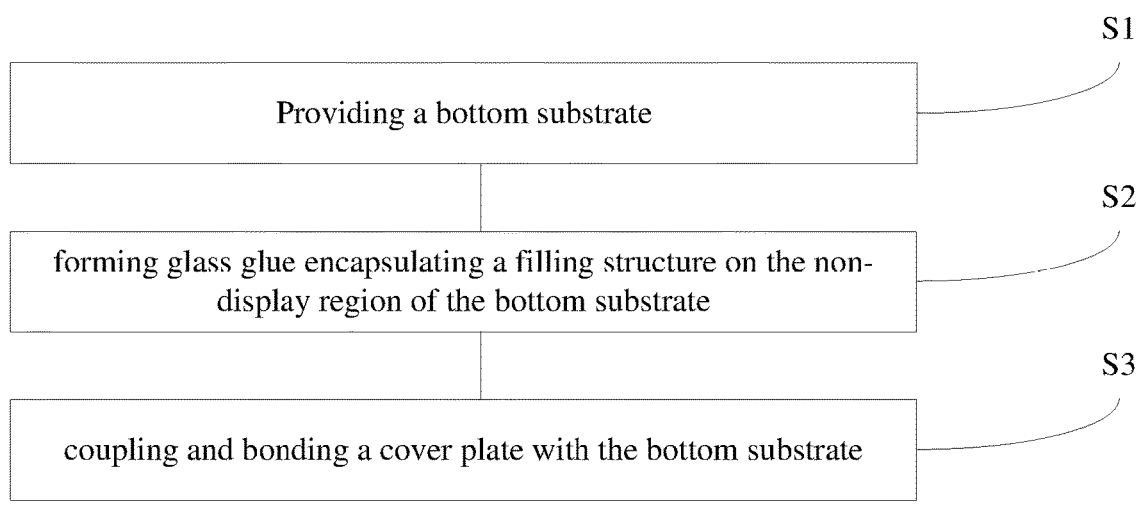
FIG. 15 illustrates an exemplary display panel packaging process according to the disclosed embodiments.

FIG. 15 illustrates an exemplary display panel packaging process according to the disclosed embodiments. The packaging process is a frit packaging process. FIG. 5 illustrates a corresponding display panel.

As shown in FIG. 15, the display panel packaging process may include following steps.

S1: providing a substrate 10. The substrate 10 may include a display region (not labeled) and a non-display region (not labeled).

S2: forming sealant 30 covering a filler layer 40 on the non-display region of the substrate 10.

S3: coupling and bonding a cover plate 20 with the substrate 10.

During the step S2, the gel-phase sealant 30 may be coated in the non-display region of the substrate 10 first; and then pre-baking and sintering the sealant 30 to solidify the sealant 30. During the step S3, the cover plate 20 may be aligned and bonded with the substrate 10 having the sintered sealant 30 first; and then a laser sealing process may be performed to cause the upper face of the sealant 30 to tightly contact with the surface of the cover plate 20.

Figure 16:
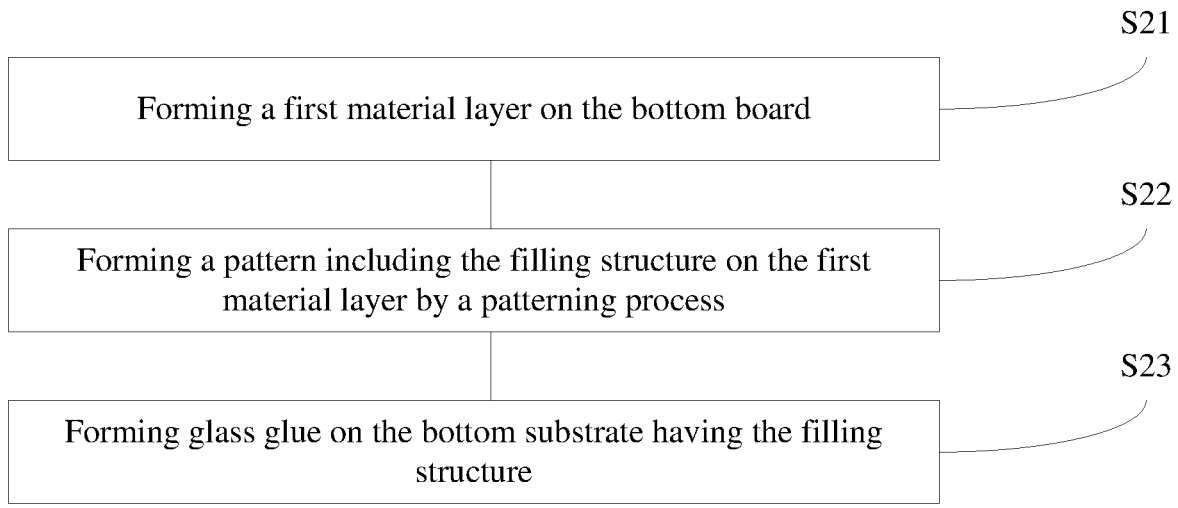
FIG. 16 illustrates an exemplary fabrication process of the filler layer according to the disclosed embodiments.

Specifically, as shown in FIG. 16, the step S2 for forming the sealant 30 encapsulating the filler layer 40 on the non-display region of the substrate 10 may include following steps.

Figure 6:
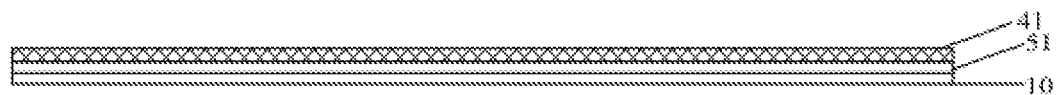
FIG. 6 illustrates an exemplary substrate after forming a first material layer and a second material layer according to the disclosed embodiments.
Figure 7:
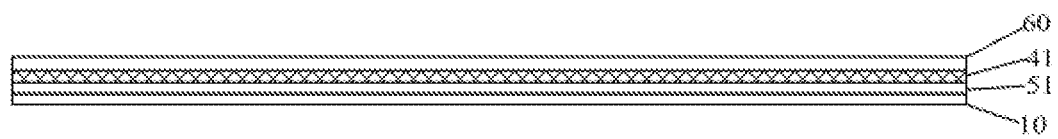
FIG. 7 illustrates an exemplary structure after forming a photoresist layer on the first material layer according to the disclosed embodiments.
Figure 8:
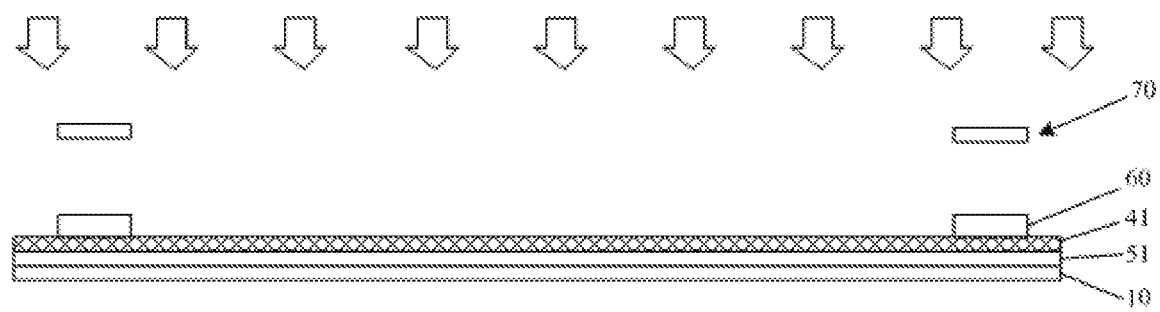
FIG. 8 illustrates an exemplary structure after exposing and developing the photoresist layer illustrated in FIG. 7 according to the disclosed embodiments.
Figure 9:
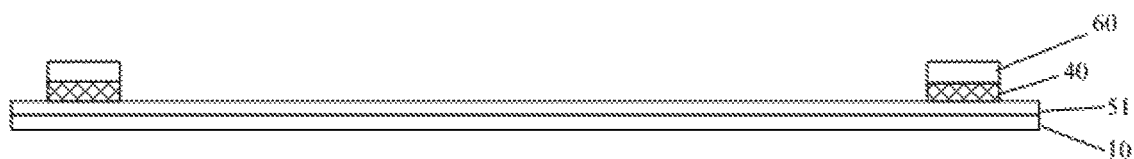
FIG. 9 illustrates an exemplary structure after etching the first material layer according to the disclosed embodiments.
Figure 10:
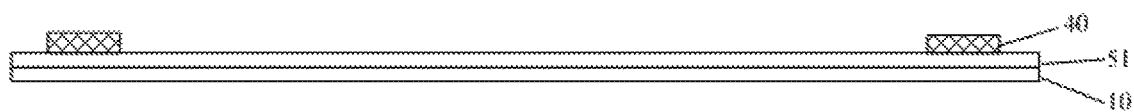
FIG. 10 illustrates an exemplary structure for forming a filler layer according to the disclosed embodiments.

S21: forming a first material layer 41 on the substrate 10 (as shown in FIG. 6). Various processes may be used to form the first material layer 41, such as a chemical vapor deposition (CVD) process, or a physical vapor deposition (PVD) process, etc. In one embodiment, the first material layer 41 is formed by a PVD process. The first material layer 41 may be used to subsequently form the filler layer 40;

S22: forming a pattern including the filler layer 40 on the first material layer 41 by a patterning process. Specifically, a first photoresist layer 60 may be formed on the first material layer 41 (as shown in FIG. 7). Then, the first photoresist layer 60 may be exposed using the first mask 70; and developed to remove the portion of the first photoresist layer 60 on the substrate 10 in the display region; and the first material layer 41 in the display region may be exposed (as shown in FIG. 8). Then, the exposed portion of the first material layer 41 in the display region may be etched by a dry etching process; and the portion of the first material layer 41 around the display region may be kept (as shown in FIG. 9). Then, the first photoresist layer 60 may be removed; and the filler layer 40 may be formed on the substrate 10 around the display region (as shown in FIG. 10); and S23: forming the sealant 30 on the substrate 10 having the filler layer 40. The filler layer 40 may be in the middle of a cross-section of the sealant 30 perpendicular to the coating direction of the sealant 30.

Further, the material for forming the sealant 30 may include glass powder. The glass powder may include one or more $SiO_2$ powder, $CaCO_3$ powder, ZnO powder, and $TiO_2$ powder. When the sealant 30 is being coated, the gel-phase sealant 30 is coated on the substrate 10. After a sintering process, water and other medium in the gel-phase sealant 30 may be evaporated; and the gel-phase sealant 30 may be turned into powder-phase glass. The substrate 10 and the cover plate 20 may be both glass substrates; and the major composition of the glass substrates may be similar to the glass powder. When the laser sealing process is performed, the sealant 30 may have better adhesion with the cover plate 20 and the substrate 10.

Further, in order to the cause the filler layer 40 and the sealant 30 to have tight contact, the thermal expansion coefficient of the filler layer 40 may be consistent with the thermal expansion coefficient of the sealant 30. As described previously, the material for forming the sealant 30 may include the glass powder. Thus, in one embodiment, the material of the first material layer may include Ti, or Ti alloy.

Further, the width of the filler layer 40 may be approximately 20%~30% of the width of the sealant 30 (i.e., the finished sealant structure 30 or the solid bulk-phase sealant 30); and/or the height of the filler layer 40 may be 15%~20% of the height of the sealant 30. In a practical display panel packaging process, when the width and the height of the sealant 30 are determined, the width and the height of the filler layer 40 may be correspondingly determined. Thus, the width of the pattern of the mask 70 and the thickness of the first material layer 41 may be determined.

Usually, as shown in FIG. 5, the sealant 30 may not be directly formed on the surface of the substrate 10; and may be disposed on a dissipation layer 50. The method for forming the heat dissipation layer 50 may be similar to the method for forming the filler layer 40. The method may include following steps.

S20: forming a second material layer 51 (as shown in FIG. 6) before the step S21.

S221: forming a pattern having the heat dissipation layer 50 by patterning the second material layer 51.

The material for forming the second material layer 51 may include Ti, or Ti alloy, such that the thermal expansion coefficient of the heat dissipation layer 50 may be similar to that of the sealant 30.

Figure 11:
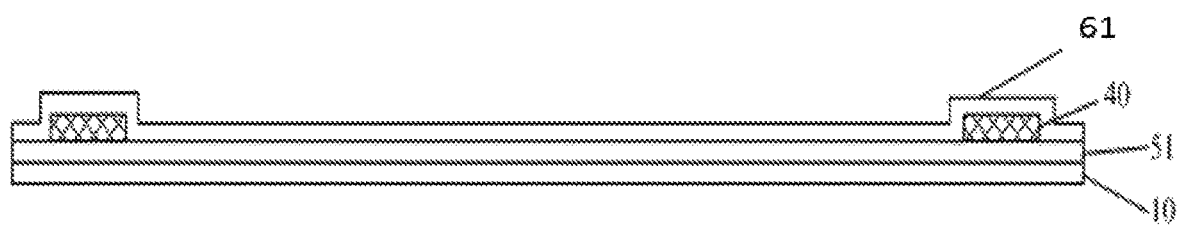
FIG. 11 illustrates an exemplary structure for forming a photoresist layer on the substrate having the second material layer and the filler layer according to the disclosed embodiments.

In the step S221, the filler layer 40 and the heat dissipation layer 50 may be formed separately. That is, a second photoresist layer 61 is formed on the second material layer 51 having the filler layer 40 (as shown in FIG. 11); and then the second photoresist layer 61 may be exposed using a second mask 71.

Figure 12:
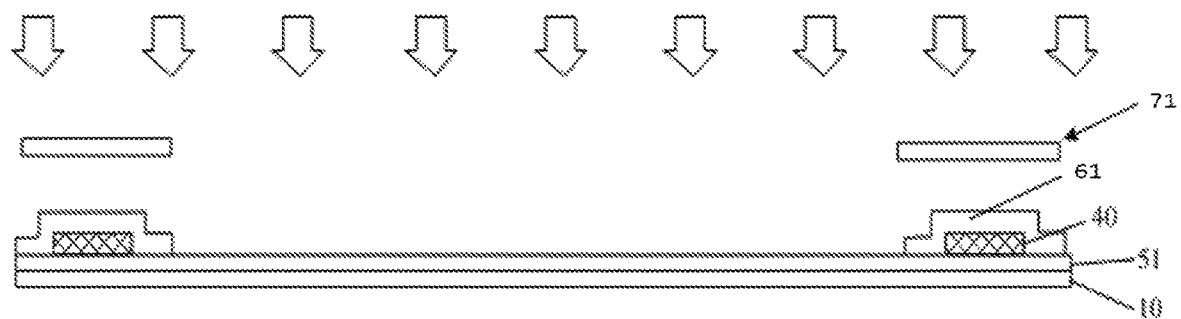
FIG. 12 illustrates an exemplary structure after exposing and developing the photoresist layer illustrated in FIG. 11 according to the disclosed embodiments.

As shown FIG. 12, the opening of the second mask 71 may be corresponding to the display region. Because the sealant 30 may be disposed on the heat dissipation layer 50; and the width of the sealant 30 may be greater than the width of the filler layer 40, the opaque area of the second mask 71 used for forming the dissipation layer 50 may be greater than the width of the opaque area of the first mask 70 used for forming the filler layer 40. That is, on a cross-section of the sealant 30, the width of the heat dissipation layer 50 is greater than the width of the filler layer 40.

Figure 13:
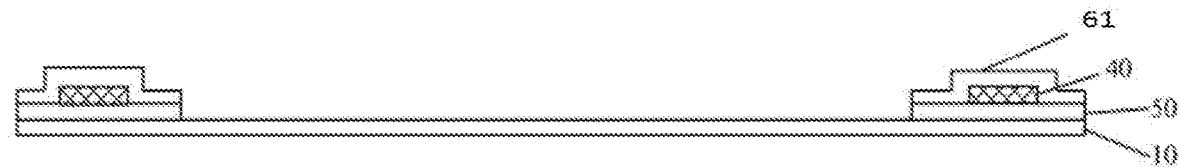
FIG. 13 illustrates an exemplary structure after etching the second material layer according to the disclosed embodiments.
Figure 14:
FIG. 14 illustrates an exemplary structure after forming the dissipation layer according to disclosed embodiments.

After exposing the second photoresist layer 61 using the second mask 71, the exposed second photoresist layer 61 may be developed to remove the portion of the second photoresist layer 61 in the display region to expose the second material layer 51. Then, the exposed portion of the second material layer 51 may be etched (as shown in FIG. 13) by a dry etching process; and the second photoresist layer 61 may be removed to form the heat dissipation layer 50 (as shown in FIG. 14). In order to increase the adhesion force between the heat dissipation layer 50, the filler layer 40, and the sealant 30, the surface of the heat dissipation layer 50 and/or the filler layer 40 may be grinded to increase friction.

When the first material layer 41 and the second material layer 51 are made of a same material, the filler layer 40 and the heat dissipation layer 50 may be formed by one-step patterning process. That is, after forming the second material layer and forming a photoresist layer on the first material layer, a half-tone mask may be used to expose the photoresist layer.

After a developing process, the top surface of the first material layer may have a region coated with thicker photoresist, a region coated with a thinner photoresist, and a region having no photoresist. After etching the region of the second material layer having no photoresist, the thinner photoresist may be removed by a plasma ashing process; and then the region of the second material layer under the thinner photoresist layer may be removed by a second etching process. Then, the remaining photoresist layer may be removed. Thus, the filler layer 40 and the heat dissipation layer 50 may be formed.

In certain other embodiments, when the material of the sealant 30 includes glass powder; and the glass powder includes one or more of $SiO_2$ powder, $CaCO_3$ powder, ZnO powder, and $TiO_2$ powder, the material for forming the filler layer 40 may include $SiO_2$. Under this condition, the substrate 10 may be a glass substrate; and the material of the substrate 10 may include $SiO_2$. Because the material of the filler layer 40 and the material of the substrate 10 may all include $SiO_2$, it may be still able to obtain a relatively large adhesion force between the filler layer 40 and the substrate 10 without disposing the heat dissipation layer 50 between the filler layer 40 and the substrate 10.

Further, a display apparatus may be formed by the disclosed processes, methods, and structures. The display apparatus may include at least one disclosed display panel. The display panels may be disposed as a matrix; and interconnected by any appropriate other devices and structures.

Figure 17:
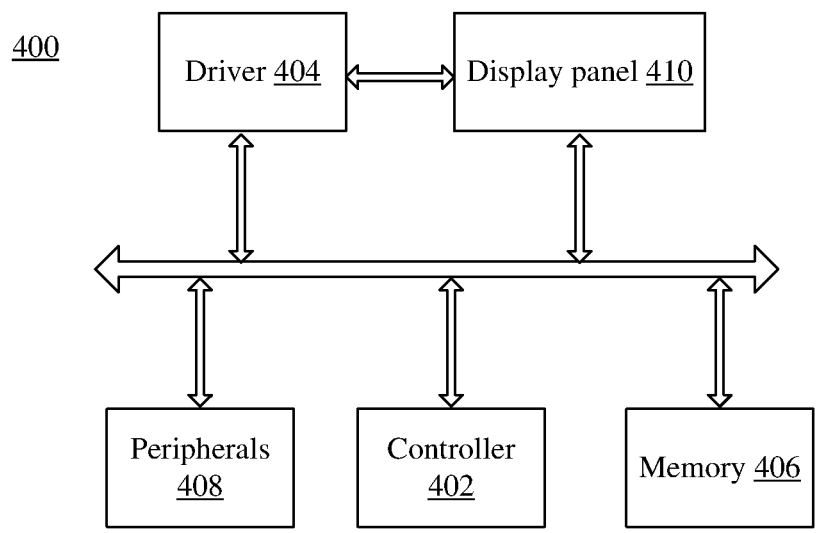
FIG. 17 illustrates a block diagram of an exemplary display apparatus according to the disclosed embodiments.

FIG. 17 illustrates the block diagram of an exemplary display apparatus 400 incorporating certain disclosed display panels. The display apparatus 400 may be any appropriate device or component with certain display function, such as an OLED display, an OLED TV, a monitor, a cell phone or smartphone, a computer, a tablet, or a navigation system, etc. As shown in FIG. 17, the display apparatus includes a controller 402, driver circuitry 404, memory 406, peripherals 408, and at least one display panel 410. Certain devices may be omitted and other devices may be included.

The controller 402 may include any appropriate processor or processors, such as a general-purpose microprocessor, digital signal processor, and/or graphic processor. Further, the controller 402 can include multiple cores for multi-thread or parallel processing. The memory 406 may include any appropriate memory modules, such as read-only memory (ROM), random access memory (RAM), flash memory modules, and erasable and rewritable memory, and other storage media such as CD-ROM, U-disk, and hard disk, etc. The memory 406 may store computer programs for implementing various processes, when executed by the controller 402.

Peripherals 408 may include any interface devices for providing various signal interfaces, such as USB, HDMI, VGA, DVI, etc. Further, peripherals 408 may include any input and output (I/O) devices, such as keyboard, mouse, and/or remote controller devices. Peripherals 408 may also include any appropriate communication module for establishing connections through wired or wireless communication networks.

The driver circuitry 404 may include any appropriate driving circuits to drive the display panel 410. The display panel 410 may include one or more of the disclosed display panels. During operation, the display panel 410 may be provided with image signals by the controller 402 and the driver circuitry 404 for display.

Because the display panel may have the filling structure; and the packaging quality may be enhanced, the service life of the display panel may be increased. Therefore, the quality of the display apparatus having the plurality of such display panels may be enhanced; and the service life of the display apparatus may be increased as well.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A display panel, comprising:
   a substrate having a display region and a non-display region;
   a cover plate;
   a sealant between the substrate and the cover plate and in the non-display region for bonding the substrate and the cover plate;
   a filler layer covered by the sealant to cause the sealant to have tight contact with the substrate and with the cover plate;
   a heat dissipation layer between the substrate and the sealant; and
   the filler layer between the sealant and the heat dissipation layer.

2. The display panel according to claim 1, wherein:
   the tiller layer is on the substrate, and in the center region of the sealant from a cross-sectional view; and
   the filler layer is parallel to the sealant along a longitudinal direction of the sealant.

3. The display panel according to claim 2, wherein:
   a thermal expansion coefficient of the filler layer is substantially consistent with a thermal expansion coefficient of the sealant.

4. The display panel according to claim 3, wherein:
   a material for forming the filler layer includes one of Ti and Ti alloy.

5. The display panel according to claim 3, wherein:
   a width of the filler layer is approximately 20%~3% of a width of the sealant on a cross-section of the sealant; and/or,
   a height of the filler layer is approximately 15%~20% of a height of the sealant on the cross-section of the sealant.

6. The display panel according to claim 3, wherein:
   a material for forming the sealant includes glass powder; and
   the glass powder includes one or more of $SiO_2$ powder, $CaCO_3$ powder, ZnO powder, and/or $TiO_2$ powder.

7. The display panel according to claim 1, wherein:
   a width of the heat dissipation layer is greater than a width of the filler layer on a cross-section of the sealant.

8. A display apparatus comprising at least one display panel according to claim 1.

9. A display panel packaging method, comprising:
   providing a substrate having a display region and a non-display region;
   providing a cover plate;
   forming a filler layer on the non-display region of the substrate;

forming a sealant over the tiller layer such that the sealant has a convex-shaped top surface; and bonding the cover plate with the substrate by pressing the cover plate on the convex-shaped top surface of the sealant such that the sealant forms tight contact with the cover plate, wherein forming the sealant encapsulating the filler layer further includes:

forming a first material layer on the substrate:

forming a pattern having the filler layer in the first material layer by a patterning process; and forming the sealant on the substrate having the filling structure, wherein the filler layer is in the center region of the sealant from a cross-sectional view.

10. The display panel packaging method according to claim 9, wherein:

a thermal expansion coefficient of the filler layer is substantially consistent with a thermal expansion coefficient of the sealant.

11. The display panel packaging method according to claim 10, wherein:

a material for forming the first material layer includes one of Ti and Ti alloy.

12. The display panel packaging method according to claim 11, before forming the first material layer, further including:

forming a second material layer on the substrate; and patterning the second material layer to form a pattern having the heat dissipation layer.

13. The display panel packaging method according to claim 12, wherein:

in the circumstance that the first material layer and the second material layer are made of the same material, the filler layer and the heating dissipation layer are formed by a single patterning process.

14. The display panel packaging method according to claim 13, wherein:

the filler layer and the heat dissipation layer are both made of Ti.

15. The display panel packaging method according to claim 12, wherein:

a width of the heat dissipation layer is greater than a width of the filler layer on a cross-section of the sealant.

16. The display panel packaging method according to 12, after forming the heat dissipation layer, further including:

grinding at least one of the heat dissipation layer and the tiller layer to increase surface roughness.

17. The display panel packaging method according to 10, wherein:

the width of the filler layer is approximately 20%~30% of a width of the sealant on a cross-section of the sealant; and/or, a height of the filler layer is approximately 15%~20% of a height of the sealant.

18. The display panel packaging method according to 10, wherein:

a material for forming the sealant includes glass powder;

the glass powder includes one or more of one or more of $SiO_2$ powder, $CaCO_3$ powder, ZnO powder, and $TiO_2$ powder.

* * * * *